United States Patent [19]

Dickens

[11] 4,118,670
[45] Oct. 3, 1978

[54] IMAGE PHASED AND IDLER FREQUENCY CONTROLLED MIXER FORMED ON AN INTEGRATED CIRCUIT DIELECTRIC SUBSTRATE

[75] Inventor: Lawrence E. Dickens, Baltimore, Md.

[73] Assignee: Westinghouse Electric Corp., Pittsburgh, Pa.

[21] Appl. No.: 699,296

[22] Filed: Jun. 23, 1976

Related U.S. Application Data

[63] Continuation of Ser. No. 575,901, May 8, 1975, abandoned.

[51] Int. Cl.² .............................................. H04B 1/26
[52] U.S. Cl. ..................................... 325/446; 325/437; 333/11; 333/84 M
[58] Field of Search .............. 325/437, 442, 443, 445, 325/446, 449; 321/69 W; 333/6, 11, 84 M

[56] References Cited

U.S. PATENT DOCUMENTS

| Re. 27,755 | 9/1973 | Wen | 333/84 M |
|---|---|---|---|
| 3,611,153 | 10/1971 | Wen | 325/446 |
| 3,678,395 | 7/1972 | Hunton et al. | 325/446 |
| 3,681,697 | 8/1972 | Moroney | 325/446 |
| 3,735,267 | 5/1973 | Napoli | 325/446 |
| 3,772,599 | 11/1973 | Ernst et al. | 325/446 |
| 3,831,097 | 8/1974 | Neuf | 325/446 |

OTHER PUBLICATIONS

IBM Technical Disclosure Bulletin, vol. 17, No. 6, Nov. 1974 on "Hybrid Microstrip Mixer and Circuits Constructed Thereon" by Clouser.

*Primary Examiner*—John C. Martin
*Assistant Examiner*—Jin F. Ng
*Attorney, Agent, or Firm*—C. F. Renz

[57] ABSTRACT

The tuned elements of a mixer organization are fabricated as slot-type microwave integrated circuit (MIC) elements formed by selected masking or etching of a continuous ground plane layer of conductor material on one side of an integrated circuit dielectric substrate, and of the discrete strips and other geometric forms affixed to the other side of the substrate. A pair of longitudinally aligned coplanar strip transmission line sections with an intermediate short longitudinally aligned slot transmission line section therebetween form hybrid junctions containing balanced diode modulation circuits where such coplanar lines and the slot line are joined. A strip line unit formed on the other side of the substrate is the input port for the RF input signal and is configured to provide a microstrip line-slot line transition at the midpoint of the slot line, feeding the RF input signal to both hybrid junctions with the same phase. The LO input signal is applied to the respective coplanar strip line sections with a constant phase difference therebetween of 90°. This is conveniently provided by a quadrature hybrid. The IF outputs from the coplanar lines have a 90° difference in phase and are received and summed by opposite and isolated ports of another quadrature hybrid to provide a common phase output IF signal.

59 Claims, 9 Drawing Figures

IMAGE PHASED AND IDLER FREQUENCY CONTROLLED MIXER FORMED ON AN INTEGRATED CIRCUIT DIELECTRIC SUBSTRATE

CROSS-REFERENCES TO RELATED APPLICATIONS

The subject matter hereof is related to subject matter in a commonly assigned U.S. Pat. No. 3,939,430, issued Feb. 17, 1976, entitled "An Integrated Circuit, Image And Sum Enhanced Balanced Mixer" by L. E. Dickens and D. W. Maki. The present application is a continuation of an application entitled "Image Phased and Idler Frequency Controlled Mixer Formed on an Integrated Circuit Dielectric Substrate," Ser. No. 575,901, filed May 8, 1975 by Lawrence E. Dickens now abandoned.

BACKGROUND OF THE INVENTION

1. Field of the Invention

The present invention relates to microwave mixer circuits, and more particularly to broad band microwave mixer circuits of special applicability to communication systems and radar systems which are required to process low level signals. The invention also relates to improvements in microwave integrated circuit mixer structures.

The theory of the modulation products which are present in mixers which operate in accordance with the heterodyne principle is well kown. The traditional theory stresses the importance of certain modulation products produced when the radio frequency (RF) input signal and a local oscillator (LO) signal are applied to a nonlinear element. (The RF input signal will sometimes hereinafter be referred to by the symbol $f_s$, and the LO signal by the symbol $f_p$. These alternate symbols are in accordance with a convention of notations commonly used in discussions of idler frequencies, as will be hereinafter described in greater depth in connection with FIG. 1 of the drawing). These modulation products include: the sum signal, LO + RF, ($f_{-2}$ in the system of notations for idler theory); the intermediate frequency signal, (IF) or difference frequency LO − RF, ($f_0$ in the system of notations for idler theory); and the image frequency 2LO − RF, ($f_{+1}$ in the system of notations for idler theory). Recent theory stresses the importance of various other products of modulation. In accordance with this recent theory, if an RF signal is sufficiently small, then the resulting frequencies can be given as $f_n = nf_p + f_o$; $n = -\alpha, \ldots, +\alpha$; where $f_o = |f_s - f_p|$ is the output (IF) frequency, $f_s$ and $f_p$ being the RF and LO frequencies, respectively. In the application of the theory to the present invention, $f_{-1}$ corresponds to the signal frequency, and $f_{+1}$ to the image frequency. For most mixer applications $f_o << f_p$, and therefore this notation has the advantage that $|f_n| \approx f_{+n} \approx nf_p$; $n = 1, \ldots +\alpha$; and the magnitude of the frequency is readily identifiable by its subscript. The three frequencies at the $n^{th}$ level are sometimes referred to as the $n^{th}$ order idler frequencies.

DESCRIPTION OF THE PRIOR ART

Known theory indicates that loss in converting an RF signal to an IF signal depends not only on matching the RF and IF impedances, but also upon properly terminating the sum and image frequencies as well as other idler frequencies. A primary bibliographical reference in support of this proposition is A. A. M. Saleh, *Theory Of Resistive Mixer*, Boston, Massachusetts: M. I. T. Press, 1971. The control of idlers is important in obtaining low conversion loss, but the dominate frequency to be controlled is the image frequency. If the image cannot be well shorted or opened across the full band, then the control of the other idlers will do no good. Whatever approach is used to obtain low conversion loss, they all begin with means to either open-circuit, or short-circuit the image. Single-ended mixers do not effect even and odd idler separation, and therefore are limited in their potential for obtaining low conversion loss. Balanced mixers do effect idler separation as the odd idlers appear at the input and all the even idlers appear at the output.

Balanced microwave integrated circuit mixers are known. One example of such circuit is disclosed in U.S. Pat. No. 3,678,395 "Broad Band Planar Balanced Circuit" by J. K. Hunton et al. The circuit disclosed therein uses the approach of employing a single tuned coplanar strip transmission line section which electrically connects to a slot transmission line to form a hybrid junction at which balanced diode modulation circuitry is installed. However, this approach is limited in the ability to reduce conversion losses and therefore not adequate for certain state-of-art communication and radar system requirements. The hereinbefore referenced U.S. Pat. No. 3,939,430 represents an attempt to reduce the conversion losses associated with such single coplanar line-slot line hybrid junction mixers by use of filtering and tuning for image and sum enhancement. However, the latter approach requires image termination control by a narrowband filter, and thereby necessarily results in bandwidth limitations.

Another known approach for the enhancement of mixer operation by means of control of impedances is the image phasing type of mixer. The latter approach makes it possible to obtain image rejection and to recover a large part of the image energy normally lost in the signal conversion process. U.S. Pat. No. 3,831,097 entitled "Image Recovery Receiver" by D. Neuf is an example of an application of this approach which yields wide-band mixer operation. However this approach requires a pair of diode quads and three microwave baluns in addition to a pair of quadrature hybrids for processing the LO and IF signals, and therefore results in circuit complexity because of the large number of circuit elements.

In addition to the above-mentioned needs for achieving lower conversion losses in broad band mixers, there is a continuing need for improvements in integrated circuit balanced mixer circuits to provide better electrical performance, improve reproducibility and lower production cost.

SUMMARY OF THE INVENTION

Broad band balanced mixer apparatus is disclosed which employs the approach of image phasing and which utilizes techniques of fabrication of dielectric substrate type integrated circuits. A pair of longitudinally aligned coplanar strip transmission line sections and a very short slot transmission line section therebetween, are formed in a layer of metal conductor affixed to one face of a wafer of dielectric substrate. The ends of the coplanar lines are joined to the slot line in a manner forming hybrid junctions, and diodes circuits for balanced modulation are operatively connected at each of the two hybrid junctions. A stip member is affixed to the opposite face of the substrate in a position to transversely cross the midpoint of the very short section of slot line. This strip member is the RF signal input port and is configured to provide a broad band microstrip transmission line to slot line transition directly across the substrate from the midpoint of the slot line. It will be apparent that each coplanar line has an end terminating in the hybrid junction (hereinafter sometimes called the "hybrid junction end") and an end remote from the hybrid junction (hereinafter sometimes called the "remote end"). Also affixed to said other side of the substrate are a pair of microstrip transmission lines which serve as part of the LO input coupling and IF output coupling for each of the respective coplanar transmission lines. Each of these microstrip lines has one end located across from the remote end of the center strip of the corresponding coplanar line. There is for each coplanar strip line and associated microstrip line a feedthrough conductor extending through an aperture in the substrate and the conductor electrically connects the end of the center strip and the microstrip line. The overall organization is a pair of balanced mixers having a single RF input coupling port and having individual input/output couplings. The LO signal source is connected to port one of a conventional four-port quadrature hybrid. The output of ports two and four which have a constant phase difference of 90°, are applied to one and the other of the balanced mixers via their respective microstrip and feedthrough conductor units. The IF outputs, extracted from the respective mixers via the microstrip coupling lines are combined in another four-port quadrature hybrid, this time being applied to any two opposite and isolated ports thereof such as ports two and four respectively. The quadrature hybrid operates to combine them as a single phase signal at port one. The configuration of the hybrid junctions formed by intersection of the ends of the very short slot line section with the adjoining coplanar lines, and the microstrip line to slot line transition causes the image frequency modulation products appearing at the RF input line and generated by each of the balanced mixers to be out-of-phase with each other, resulting in maximum image current or equivalently the short circuited image condition. This short-circuit condition is not band-width limited because the electrical length between the diodes of the two balanced mixers is essentially zero. Each of the coplanar lines has an electrical length equal to one-quarter wavelength of the second harmonic of the LO signal in order to effect a near open circuit condition at the hybrid junction for the second order idler signals. The second idler (sum and its image) and all other even idlers will appear at the remote end of each coplanar line where an effective low impedance exists to them. The third and other odd idlers appear at the signal input junction where some are out-of-phase and short-circuited in the same way as the image and others are short-circuited by the shunting action of the coplanar line and the diodes junction capacitance. The overall result is a mixer circuit which functions to short-circuit the image, open-circuit the second idlers, and short-circuit all higher idlers, and all this is done without the use of an image filter thereby enabling broad band operation.

DETAILED DESCRIPTION

Figure 1:
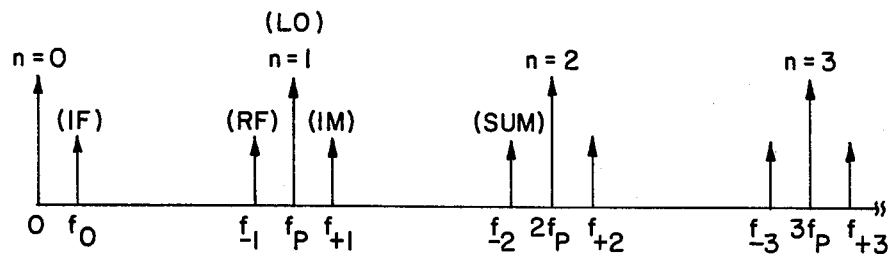
FIG. 1 is a diagrammatic representation of a frequency spectrum showing the modulation products which are produced in accordance with the heterodyne principle by which a mixer operates.

Reference is now made to the drawing and in particular to FIG. 1, which shows a diagrammatic of a frequency spectrum with the modulation products which exist according to well known heterodyne principles appearing therein. If the received RF signal is sufficiently small that the mixer can be considered distortion-free, then the resulting frequencies can be given as $f_n = nf_p + f_o$; $n = -\alpha, \ldots, +\alpha$; where $f_o = |f_s - f_p|$ is the output (IF) frequency, $f_s$ and $f_p$ being the RF and LO frequencies, respectively. Note also that in the present invention, $f_{-1}$ corresponds to the received RF signal, and $f_{+1}$ to the conventionally designated image frequency. For most mixer applications $f_o << f_p$, and therefore this notation has the advantage of the circumstances that $|f_n| \approx f_{+n} \approx nf_p$; $n = 1, \ldots +\alpha$; and the magnitude of the frequency is readily identifiable by its subscript. Further, for a particular group about $nf_p$, the plus (+) subscript always refers to the upper side band and the negative (−) subscript always refers to the lower side band. The three frequencies at the $n^{th}$ level will sometimes in this description and in the appended claims be referred to as the $n^{th}$ order idler frequencies.

An important feature of the invention is that image frequency rejection is obtained with recovery of a large part of the image energy normally lost in the signal conversion process. This is achieved in a manner which corresponds to the theory of operation of the image phasing type of single side band mixer (demodulator). To aid in the description of the invention, the structure and operation of such an image phasing type mixer will presently be discussed by reference to FIG. 2. A mixer 10 has as its input a radio frequency (RF) input signal introduced at input port 12. From there it is fed to a 180° hybrid 14, also herein represented as a "T" junction, which in turn feeds a pair of balanced mixers 16 and 18. The local oscillator (LO) signal is introduced at an LO input port 20 and from there applied to one of the ports of a four-port quadrature hybrid 22. Hybrid 22 provides equal LO signal components with a constant phase difference of 90° to balanced mixers 16 and 18. Due to the diference in phase of the LO signals applied, the image and IF signals in the respective mixers have corresponding 90° phase differences. The IF outputs from mixers 16 and 18 are combined in another quadrature hybrid 24. These respective IF signals are received and summed in opposite (and isolated) arms of hybrid 24 where they are combined into a common phase IF output emerging from another of the four-ports. For a given RF signal input, there will be image components (and, in fact, all odd idlers) caused to flow out of mixers 16 and 18 toward the "T" junction 14. These components will be of such relative phases that they will combine at the "T" junction 14 in such a manner to either propagate out the input port 12 (in-phase components) or reflect back into the mixers (out-of-phase components). The image waves are out-of-phase so that they will be reflected back to the mixers and by adjusting the distance A between the mixers, any apparent phase termination to the image can be made to appear at the mixer (from short-circuited image to open-circuited image). The third idlers ($n = 3$) will appear at "T" junction 14. These are the frequencies, $3f_p \pm f_o$. Waves of frequency $3f_p - f_o$ are likewise out-of-phase and will be reflected back to their mixers; the waves of frequency $3f_p + f_o$ are in-phase and will travel out of the input port if so allowed. However, for applications of RF input signals in the 2-4 GHz band for example, the $3f_p + f_o$ frequencies cover the band from 6 GHz to 12 GHz, and therefore can easily be reflected back to the mixers by proper filtering. The remaining odd idlers are similarly treated, but being of even greater frequency are more easily filtered.

Figure 3B:
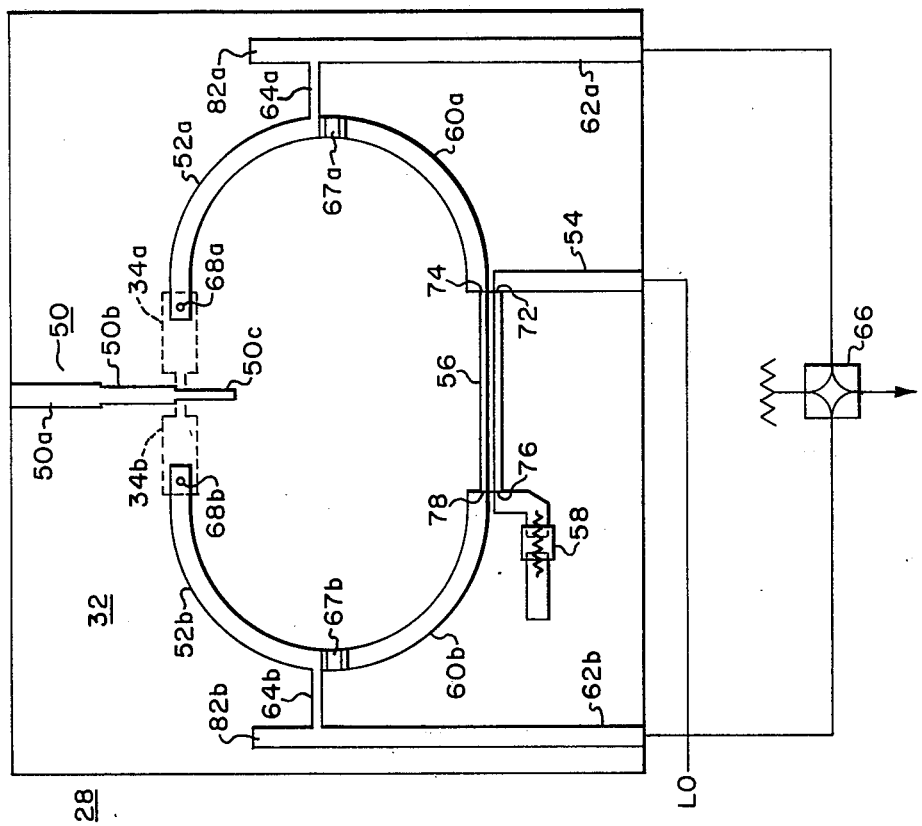
FIGS. 3A and 3B are greatly enlarged top and bottom plan views, respectively, of an integrated circuit type construction of a mixer circuit in accordance with the present invention, the IF quadrature hybrid which is not included in the integrated circuit construction being shown schematically, and a fragment (in the upper right hand corner of FIG. 3A) of the ground plane layer of conductor material being cut away to show the underlying dielectric substrate wafer.
Figure 3A:
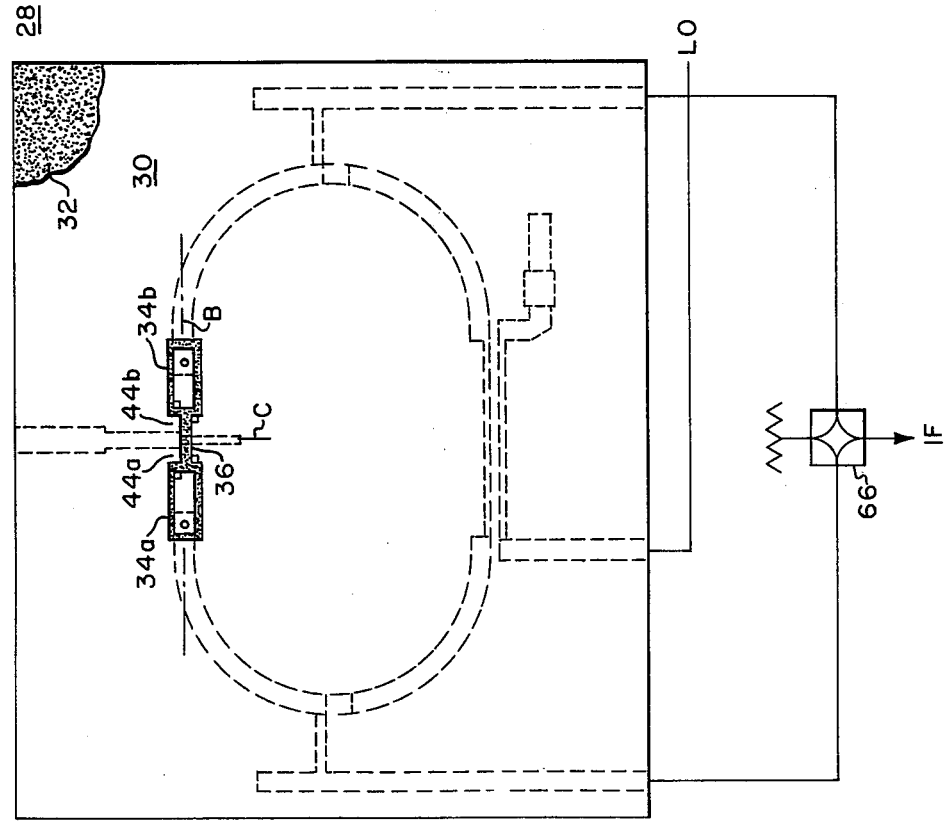

Referring now to FIGS. 3A and 3B a mixer in accordance with the present invention is composed of a microwave integrated circuit (MIC) unit 28, which is fabricated in the manner of conventional MIC constructions. In a conventional MIC construction a wafer of suitable dielectric substrate material, such as alumina, has a ground plane face which is a continuous layer of conductor material applied to the substrate. Slot-type MIC circuit elements are formed in this ground plane conductor layer, either at the time of application of the ground plane layer by selective masking, or after the layer is applied by etching. Discrete strips and other geometric forms of metal layer elements are affixed to the opposite face of the substrate. FIG. 3A is a top plan of MIC unit 28 viewed from the ground plane side showing ground plane layer 30 and showing the slot-type structures as portions in which the conductor layer 30 does not cover the underlying substrate 32. In FIG. 3A, strips or other geometric forms of metal layer elements affixed to the opposite face of the substrate are shown by dashed lines. FIG. 3B is a bottom plane of MIC unit 28 in which the metal layer elements on the face opposite the ground plane appear are depicted by solid lines, and in which outlines of the slot-like elements formed in the ground plane face are depicted by dashed lines. Both FIGS. 3A and 3B include coupling connections and circuit elements which are external to MIC unit 28.

Figure 4:
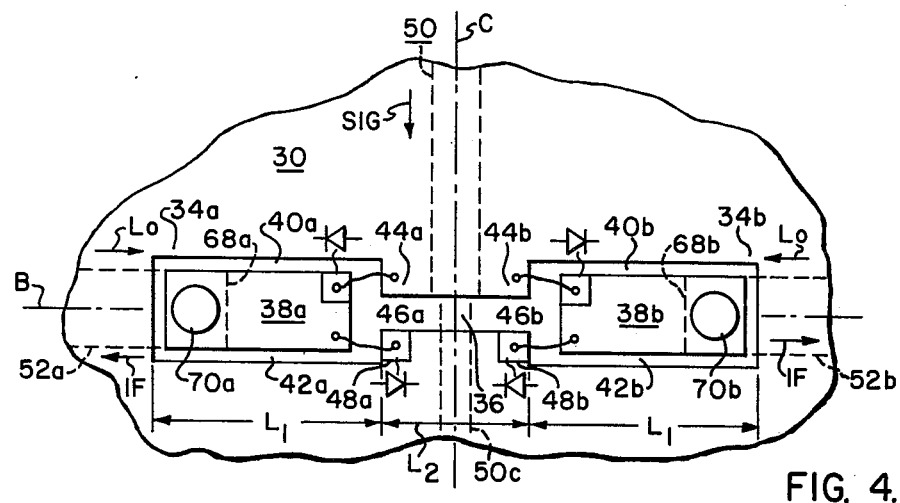
FIG. 4 is an enlarged detail of the top plan of FIG. 3A.

Referring now to FIGS. 3A and 4, the portions of MIC unit 28 formed in the ground plane face of substrate 32 will be described. A pair of coplanar strip transmission line sections 34a, 34b (or simply "coplanar lines") and a slot transmission line section 36 (or simply "slot line") are formed in conductor layer 30, with the slot line 36 between the coplanar line pair 34a, 34b. The three transmission line sections are longitudinally aligned along a common longitudinal reference axis B.

A transverse reference axis C passes through the midpoint of slot line 36 and the three transmission line sections are configured with bilateral symmetry about axis C. The coplanar lines 34a and 34b have center strips 38a, 38b of FIG. 4. In accordance with conventional theory of MIC coplanar line operation the wave guide or transmission line properties are produced by the separation of the center strips by longitudinally extending gaps 40a, 42a and 40b, 42b to one and the other sides of the center strips in the respective coplanar line. In accordance with conventional theory a coplanar strip line is a balanced-double return transmission line with the center strip (38a, 38b) constituting the common wave guiding element and the portions of conductor layers 30 adjoining the outer side of each longitudinally extending gap (40a, 42a, and 40b, 42b) constituting the double return wave guiding elements. It will be apparent that each coplanar line has an end terminating in the hybrid junction (sometimes in these specification and the appended claims called the "hybrid junction end") and an end remote from the hybrid junction (sometimes called "remote end"). The junction of each hybrid end and the adjacent end of the slot line is configured such that the longitudinal gaps communicate with each other and with the adjacent end of the slot line, to form bifurcated type hybrid junctions 44a, 44b.

An arrangement of two mixing diodes is operatively associated with each hybrid junction. The diode arrangement of hybrid junction 44a of coplanar line 34a will now be described. Diode 46a (FIG. 4) is coupled across the upper (as shown in the drawing) fork of the bifurcated type hybrid junction 44a with its anode connected to the conductor layer 30 and its cathode connected to center strip 38a. Diode 48a is coupled across the lower (as shown in the drawing) fork of hybrid junction 44a with its anode connected to center strip 38a and its cathode connected to conductor layer 30. Thus, diodes 46a and 48a are in parallel to one another with opposed polarity from the standpoint of termination of the two, parallel, wave propagation paths of coplanar line 34a. However, from the standpoint of termination of slot line 36, diodes 46a and 48a are in series circuit and so poled to form a unidirectional series circuit across the slot line. The hybrid junction 44b of coplanar strip line 34b has associated diodes 46b and 48b, arrange substantially as described for coplanar line 34a, except that the diodes are poled to provide current conduction from the top to bottom (as shown in the drawing) across the forks of the bifurcated hybrid junction 44b.

All four diodes 46a, 46b, 48a, and 48b, are of the gallium arsenide (GaAs) Schottky Barrier Type. The primary reason for employing a Schottky Barrier diode in the present mixer application is the variable resistance property of its junction. (For this reason the Schottky diode is sometimes commonly referred to as a "varistor" in relation to the present type of mixer application). The variation of resistance of a varistor as a function of applied voltage is substantial. The reverse bias resistance is of the order of many megohms. The resistance decreases rapidly with increasing forward bias until the forward bias series resistance, $R_S$, dominates over the effect of the junction resistance. The junction resistance is in parallel with a junction capacitance, $C_j$, which is also a voltage variable component. The varistor must be designed such that the junction capacitance is minimum for a given series-limiting resistance. To compare varistors of different $R_S$ and $C_j$ values, it is useful to define a cutoff frequency, $f_{co} = (2\pi C_j R_s)^{-1}$. For this comparison, the zero bias value for $f_{co}$ is used. GaAs Schottky diodes can have an $f_{co}$ as high as 1,000 Ghz or more. One suitable method of fabricating the diode connections in the disclosed MIC circuit embodiment is to employ conventional semiconductor die bonding and wire bonding techniques.

The coplanar lines 34a and 34b each have an electrical length chosen to effect a conjugate match condition with respect to the impedance characteristic presented by the diodes across the forks of its associated bifurcated hybrid junction. Further, the electrical length is additionally chosen to effect an open circuit condition for the second order idler signals produced by operation of the diodes. In cases of mixer applications for signal frequencies of the order of 2-12 Ghz having IF frequencies of the order of 40-80 MHz this combination of properties can be achieved by a choice of physical length $L_1$ representing approximately one-quarter wavelength of the second harmonic of the RF input signal. It happens that this corresponds to about one-eighth wavelength of the RF input signal, which will provide the desired conjugate match conditions relative to a GaAs Schottky Barrier diode. The length $L_2$ of slot line section 36 is selected to represent a small fraction of a wavelength of the RF signal. In one successful embodiment, $L_2$ was approximately 0.02 wavelength of the RF input signal.

The MIC circuit elements formed on the opposite face of substrate 32 will now be described with reference to FIG. 3B and also with reference to certain elements depicted by dashed lines in FIG. 4. Broadly there are three functional groupings of elements on this side. Firstly, microstrip unit 50, and microstrip lines 52a and 52b all have functions relating to the coupling of signals to and from slot line 36 or to or from coplanar lines 34a and 34b. Secondly, microstrip line 54, interdigitated strip line quadrature hybrid 56, termination resistance unit 58, and microstrip lines 60a and 60b all have functions related to coupling and processing the LO signal. Thirdly, microstrip lines 62a and 62b, and microstrip elements 64a and 64b all have functions related to the coupling of IF signals. Although quadrature hybrid 66 is not a part of MIC structure, it functionally relates to processing the IF signal and will be discussed as a part of the grouping which contains microstrip lines 62a and 62b, and elements 64a and 64b.

Microstrip unit 50 extends from the upper (as shown in the drawing) edge of the substrate and is in alignment with the transverse reference axis C. Further, it is configured to have three linear sections of different widths consisting of: section 50a nearest the substrate edge, an intermediate section 50b of narrower width than that of 50a, and a terminal end section 50c of narrower width than that of 50b. Sections 50b and 50c each are of a nominal length equal to one-quarter wavelength of the RF input signal and are positioned with the change in width at their junction located exactly across from the centerline of slot line section 36. This configuration of member 50 serves as a broad band transition for coupling RF signals applied at the substrate edge portion thereof to slot line 36. The width of sections 50a and 50b, respectively are chosen to provide predetermined electrical transmission lines characteristics of the transition. More particularly, linear section 50c constitutes a quarter-wave stub, and linear section 50b constitutes a resonant transformer section. Unit 50 functions as the "T" junction 14 of the image phasing mixer system of FIG. 2.

Microstrip line 52a is generally arcuate in shape. One of its ends is physically joined to microstrip element 64a and is electrically connected to microstrip element 60a via a conventional beam leaded (BLC) or chip capacitor 67a. The other end terminates in a short linear section 68a (best seen in dashed lines in FIG. 4) which is in juxtaposed relationship to an end portion of center strip 38a at the remote end of coplanar line section 34a. A feedthrough conductor 70a extends through an aperture (not shown) in substrate 28 and electrically couples microstrip line 52a and center strip 38a. The arrangement of microstrip line 52a and feedthrough conductor 70a functions as a band transition which couples wave energy in and out of coplanar line 34a. Because of the wide frequency separation between LO and IF signals in microwave applications, the arrangement comprises a common coupling element for both the input of the LO signal and the output of the IF signal. These two signals are simultaneously diplexed through this coupling. A coupling arrangement of the same type is provided at the remote end of coplanar line section 34b, corresponding parts being assigned the same reference numerals, but have a suffix "b."

An LO signal from any suitable LO source is applied to microstrip line 54 and thence to interdigitated quadrature hybrid 56, also known as a Lange hybrid. Interdigitated quadrature hybrid 56 is comprised of narrow parallel strip lines with alternate lines tied together and edge coupled (not shown due to the scale of FIG. 3A being too small) to form four-ports, consisting of port-one 72, port-two 74, port-three 76, and port-four 78. Hybrid 56 has the properties such that a wave applied to port-one is equally divided to emerge from ports two and four, but none from port-three. A phase shift of 90° occurs between the outputs at ports two 74 and four 78. Port three 76 is conventionally connected to termination resistance element 58 to obviate reflection of energy. One end of microstrip lines 60a is connected to port two 74 and one end of microstrip line 60b is connected to port four 78. The other ends of these lines are respectively connected to members 52a and 52b through BLC capacitors 67a and 67b respectively. The capacitors are chosen to pass the LO signal, but stop any IF signal which is present on lines 52a or 52b from entering the LO signal coupling structure. More specific information concerning the interdigitated quadrature hybrid is found in Julius Lange, "Interdigitated Strip Line Quadrature Hybrid" 1969 G-MTT Symposium Digest, May 1969, pp. 10-13. The foregoing organization takes one local oscillator (LO) power applied to microstrip line 54 and introduces it into the respective coplanar lines 34a and 34b with a constant phase difference of 90°.

Figure 2:
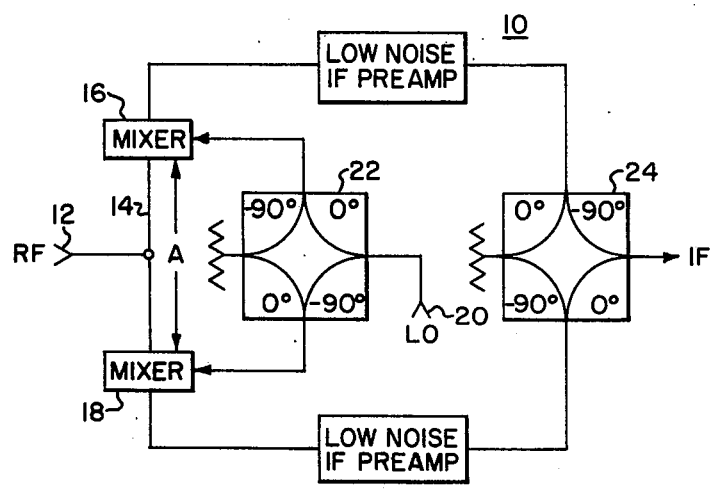
FIG. 2 is a block diagram schematic of an image phasing type of single side band mixer.
Figure 5:
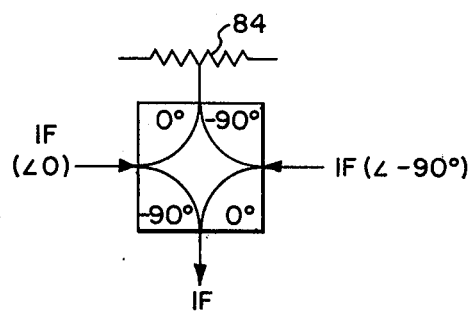
FIG. 5 is an enlarged detail of the IF quadrature hybrid shown in FIGS. 3A and 3B.

The operation of mixer diodes 46a and 48a at hybrid junction 44a, and of diodes 46b and 48b at hybrid junction 44b produces IF signals in coplanar lines 34a and 34b having a 90° difference in phase between the IF signal in the two line sections. These IF signals are propagated along the respective coplanar lines toward their remote ends, where by means of the coupling arrangement of the microstrip line and feedthrough conductor units they are coupled out along microstrip lines 52a and 52b, respectively. From lines 52a and 52b the IF signals are coupled to microstrip elements 64a and 64b, respectively, and thence to microstrip lines 62a and 62b, respectively. The length of the elements 64a and 64b and of stub portions 82a and 82b of lines 62a and 62b are conventionally selected to prevent the coupling of the LO signal into IF output channels. As best shown in FIG. 5, the signals from lines 62a and 62b are summed and combined to provide an output IF having a single common phase by their application to a pair or set of opposite and isolated ports of a conventional quadrature hybrid 66 of any suitable type. The output IF signal emanates from one of the remaining opposite and isolated pair or set of ports, and the other port of the remaining set is connected to a suitable termination resistance element 84. It will be appreciated that low noise IF preamplifiers (as shown in FIG. 2) could be inserted between microstrip lines 62a and 62b and the ports of hybrid 66 yielding a lower ultimate noise figure of the overall mixer in those instances of applications where this may be desired.

It will be appreciated that many variations of structure for introducing and extracting the LO and IF signals into and from the microstrip lines 52a and 52b are possible.

Figure 6:
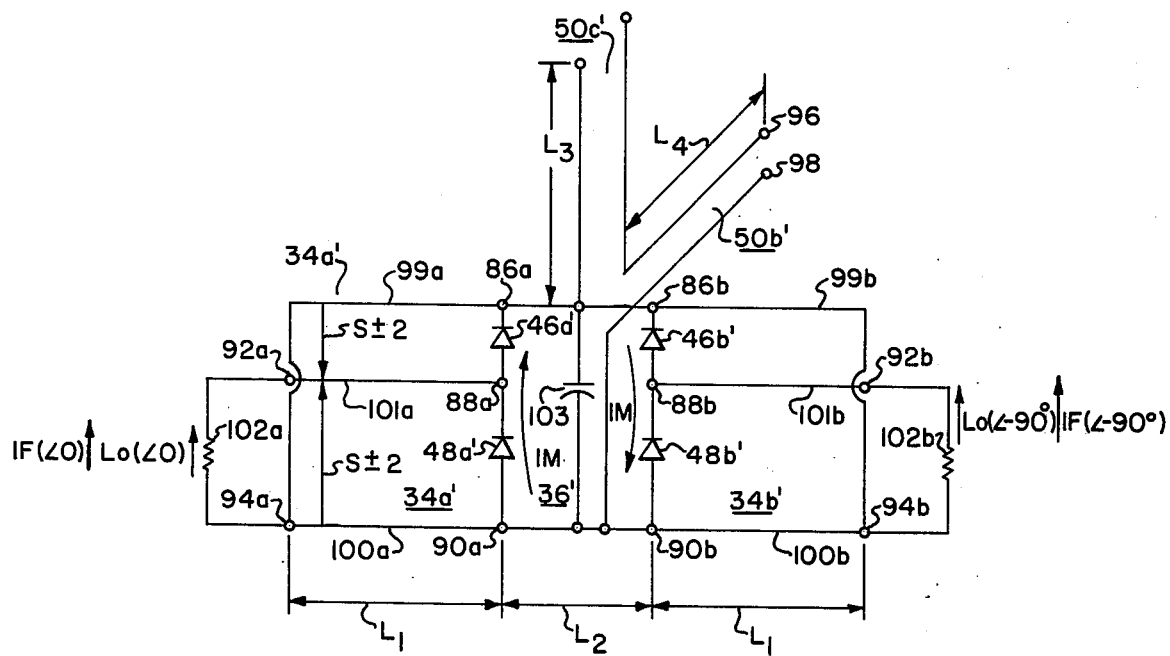
FIG. 6 is a schematic representing a circuit composed of parallel wire-transmission lines, which is believed equivalent to the microwave integrated circuit (MIC) structure in FIGS. 3A and 3B.

FIG. 6 represents a circuit composed of parallel wire transmission lines which is believed to be the equivalent of the described arrangement of coplanar strip line sections 34a, 34b, slot line section 36, and their associated input and output couplings. Coplanar lines 34a and 34b are represented as three-wire transmission line sections 34a', 34b', each having three terminals 86a, 88a, 90a, and 86b, 88b, 90b, respectively, at their adjacent or inner ends. Coplanar lines 34a' and 34b' each have two terminals 92a, 94a, and 92b, 94b, respectively, at their remote ends. The two outer wires 99a, 99b and 100a, 100b of the respective three-wire sections 34a' and 34b' represent the double return wave guide elements of coplanar line 34a, 34b (FIGS. 3A and 4), which as hereinbefore described are formed by the portions of layer 30 adjoining the outer edges of longitudinally extending gaps 40a and 42a. The inner wires 101a, 101b of sections 34a' and 34b' represent the common wave guide element formed by center strips 38a, 38b (best shown in FIG. 4). Slot line 36 is represented as a two-wire section 36' interconnecting terminals 86a and 86b, and terminals 90a and 90b. Microstrip unit 50 is represented as a two-wire line section 50b' and an associated opened ended quarter wave section 50c', which in combination effect the transition coupling to slot line section 36'. Sections 50b' and section 50c' correspond to transformer impedance linear section 50b and to quarter wave stub linear section 50c of microstrip unit 50 (best shown in FIG. 3B). Section 50b' is fed from a pair of terminals 96 and 98. The three terminal termination of the coplanar lines 34a' and 34b' at their inner ends represent the hybrid junction coupling to the common wave guide element and to the double return wave guide elements. The configuration of the coplanar lines 34a and 34b (FIG. 4) at their remote ends are a conventional shorted end termination of a coplanar line. As is well known, this type of termination of a coplanar end acts as though its two double return wave guide elements were shorted together. In the parallel wire transmission line equivalent circuit of FIG. 6 this is represented by lines 99a and 100a of coplanar line 34a' being shorted together at their outer ends, and by the corresponding configuration for lines 99b and 100b of coplanar line 34b'. Therefore line sections 34a and line section 34b at their remote ends are shown as terminating with two terminals 92a and 94a, and 92b and 94b, respectively. The outer end terminals 92a, 94a and 92b, 94b have equivalent impedances 102a and 102b respectively in shunt therewith, representing the combined impedance presented by the LO input and IF output coupling structures. For illustrative purposes terminals 92a and 94a of coplanar line section 34a' are assumed to be the terminals to which the LO signal having a zero-degree phase angle is applied, and therefore from which the IF signal having a zero-degree phase is extracted, as symbolically indicated by arrows in the Figure. Terminals 92b and 94b of line section 34b' are assumed to be the terminals to which an LO signal having −90° phase angle is applied, and therefore from which the IF signal having a −90° phase angle is extracted, as depicted by arrows thereat. An equivalent capacitance 103, representing the combined junction capacitance of the diodes 46a', 48a', 46b', and 48b' is shown connected across slot line section 36'.

The operation of the arrangement of the pair of coplanar lines 34a, 34b with a slot line 36 therebetween and the input and output couplings to and from these lines, will be described with reference to FIGS. 3A, 3B, 4 and 6. The received RF signal enters on microstrip unit 50, and is coupled to slot line 36 and thence applied to diodes 46a, 48a and 46b, 48b at hybrid junctions 44a, 44b. The quarter wave stub linear section 50c (50c' in FIG. 6) is an important agency in the effective operation of microstrip transition line 50. In-phase RF input signals are thus applied across the diode pairs. This is the embodiment of the in-phase coupling of signals to the pair of balanced mixers 16 and 18 by "T" junction 14 in the image phasing mixer system shown in FIG. 2. The LO signals on lines 52a and 52b which are phase displaced by 90° are injected into coplanar lines 34a and 34b. The IF waves generated at the diodes are phased so as to propagate out the coplanar lines back to the respective microstrip lines 52a and 52b. The diodes are arranged such that the IF output line is common with the LO input line. The wide frequency separation of the IF and LO allows very simple diplexing of the two signals (IF and LO) along microstrips 52a and 52b, with essentially zero bandwidth limiting of the IF port.

Since the input signals to the diode pairs are in-phase, then the image components generated by the diode pairs are out-of-phase as represented by the opposite directions of image current arrows IM, FIG. 6. This causes a maximum circulating image current, or equivalently a short-circuited image condition. This phase relationship will exist only for the case where the electrical length $L_2$ of slot line 36 separating the diode pairs is a small fraction of a wavelength or the other possible condition of $L_2$ being a multiple of the image frequency wavelength. Moreover, in the case of a slot line 36 having a length $L_2$ which is a small fraction of the wavelength, the short-circuit condition is not bandwidth limited because the electrical length between the diodes of the two balanced mixers is essentially zero.

The second idlers (the sum and its image) comprising the S±2 signals are shown as existing between the respective double return wave guide elements (wires 99a, 99b and 100a, 100b, FIG. 6) and the common return wave guide element (wires 101a, 101b, FIG. 6). (In the preceding symbolic expression S±2, the symbol S−2 represents the sum frequency ($n = -2$ idler) and the symbol S+2 is image ($n = +2$ idler). The equivalent impedances 102a and 102b (FIG. 6) present at the remote ends of coplanar line sections 34a and 34b are low relative to the characteristic impedance of these coplanar line sections, which aids in LO driving of the diodes. The electrical length of coplanar line sections 34a and 34b is adjusted to be slightly less than one-quarter wavelength of the center frequency of the second idlers to affect an open circuit to the second idlers. It happens that this will then be slightly less than one-eighth wavelength of the RF input signal. The equivalent capacitance 103 and the length of each coplanar line section cooperate to tend to present a parallel tuned circuit condition to the RF input signal. The quarter-wave stub linear section 50c is essentially a series resonant circuit to the RF input signal. Preferably, these two resonances are so tuned that they cooperate to give a double tuned RF signal response over a relatively wide signal band.

The third idlers appear at the signal input junction. The idlers of frequency $3f_p - f_o$ out-of-phase and short-circuited in the same way as the image. However, the idlers of frequency $3f_p + f_o$ are of the same phase and could propagate back out the input line. The latter possibility is minimized, however, by the shunting action of the coplanar lines 34a, 34b which are nominally three-eighth wavelength long at third idler center frequency, and by the shunting action of the equivalent capacitance 103 of the diode junctions.

The fourth idlers are phased to propagate only along the coplanar lines. However the apparent impedances 102a and 102b are relatively low at signal frequency, and therefore provide a sufficient bypass to the fourth idlers so that the coplanar lines, which are one-quarter wavelength long at the second idler center frequency, appear nominally as a short circuit (at center band of the fourth idlers) across the diodes. In shunt with this is the low capacitive reactance of each diode. All higher idlers will tend to be similarly shunted by equivalent capacitance 103 of the diode junctions.

Thus the objective required for a low conversion loss, broad band mixer have been meet. The image signal product of mixer operation is well shorted. The second idlers are presented with a high reactive impedance. All other idlers are well decoupled from the RF input port or the LO input port and tend to be presented with low reactive impedances. The signal circuit is double tuned across a large band.

In each coplanar line and hybrid junction organization the pair of diodes are in parallel to the IF and LO lines, but in series to the received RF line. Inasmuch as the conventional IF hybrid terminal impedance is nominally 50 ohms, the characteristic impedance of each of microstrip lines 52a, 52b is set to 50 ohms. In a short-circuited image mixer, the signal impedance is equal to the IF impedance. Therefore, the diode impedance must be nominally 100 ohms; the two in parallel then matching the 50 ohm line. The two in series will present 200 ohms to slot line 36. However, inasmuch as the branches of the slot line feeding the two mixers are essentially in parallel (see FIG. 6), the combined signal impedance at the midpoint of slot line 36 is 100 ohms. Microstrip unit 50 is easily constructed and arranged to make the transition from 50 ohm characteristic impedance at linear section 50a to a 100 ohm slot line impedance with very broad band characteristics and low loss.

Figure 7:
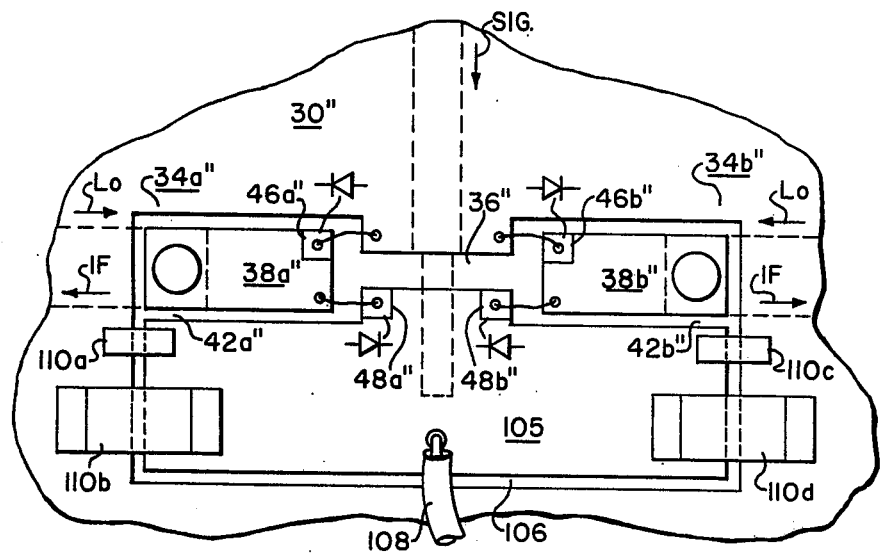
FIG. 7 is a plan view like that of FIG. 4 showing a modification of the invention.

It will be obvious by inspection of FIGS. 3A and 4 that the diodes 46a, 48a, 46b, and 48b are d.c. short-circuited. For this condition a relatively large magnitude of LO drive power is required. FIG. 7 shows a modification which circumvents this problem and therefore is useful in applications where it is important to operate with less consumption of power for the LO drive signal. Conductor layer 30" forms a d.c. bias element or pad 105 disposed adjacent one side of the longitudinally arranged pair of coplanar lines 34a", 34b" and slot line 36". Bias pad 105 is coextensive with this longitudinal arrangement of line sections, and its upper edge (as shown in the drawing) forms the lower boundary of longitudinally extending gap 42a" of coplanar line 34a", the slot of slot line 36" and longitudinally extending gap 42b" of coplanar line 34b". The other three sides of pad 105 are surrounded by a perimeter gap 106 so that complete isolation of pad 105 from the remainder of conductor layer 30 is provided. Diodes 48a" and 48b" are connected between portions of d.c. bias pad 105 adjoining the respective hybrid junctions and the center strips of the respective coplanar line sections. A lead 108 connects d.c. bias pad 105 to a suitable source of d.c. bias potential for forward biasing the diodes. A plurality of beam leaded coupling capacitors 110a, 110b, 110c, and 110d, provide a low impedance path for RF, LO, and IF signals between pad 105 and conductor layer 30. The bias potential thus applied provides forward biasing for the unidirectional series circuit composed of diodes 46a" and 48a" and the unidirectional series circuit composed of diodes 46b" and 48b". A small amount of forward bias, thusly applied, will allow significant reduction in the required magnitude of LO power.

While the invention has been described with reference to an embodiment in which slot line 36 has an electrical length which is a very small fraction of a wavelength of the image signal, useful results can be obtained using slot line lengths which are multiples of a wavelength of the image signal.

It will be apparent that the present invention provides several important features and/or advantages:

(1) image enhancement is obtained without the use of any form of bandwidth limiting image filter.

(2) a mixing operation is achieved in which the RF signal is coupled to the mixer diodes and the IF energy coupled from the mixer diodes in a very broad band and efficient (low loss) manner, avoiding losses normally encountered in RF-IF diplexing arrangements (bypass capacitors, chokes, etc.).

(3) a mixer circuit featuring low conversion losses has been obtained using MIC constructions, with their attendant advantage of improved reproducibility and lower production cost.

(4) a mixer operation has been achieved which provides tuned resonant RF signal response over relatively wide signal band.

The following Table gives the operating information concerning one successful embodiment of the present invention.

Figure 8:
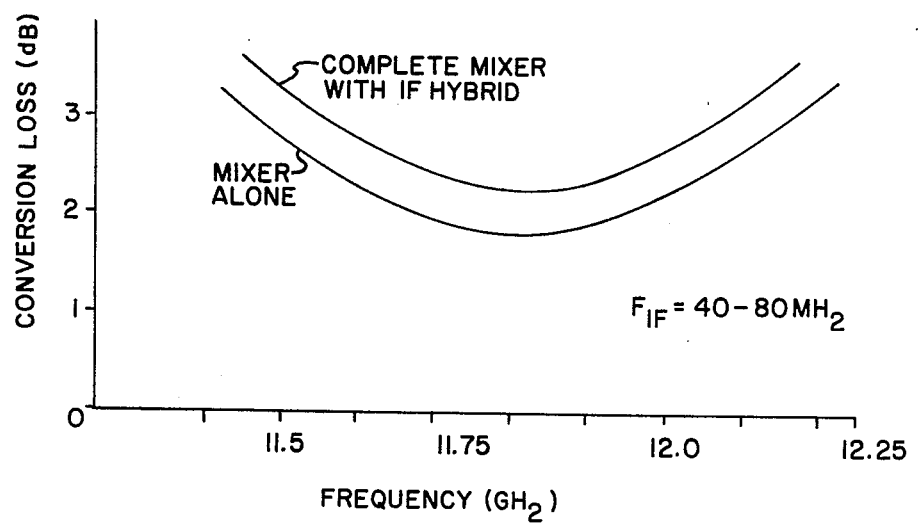
FIG. 8 is a plot of test data obtained from tests made of the circuit of FIGS. 3A and 3B.

Signal Frequency 12 GHz
LO Frequency 12.070 GHz
IF Signal 70 MHz
Conversion Loss (at center band): 2.2 dB
Conversion Loss (tunable bandwidth of 0.65 GHz): 3.0 dB
Conversion Loss across image band: > 25 dB FIG. 8 is a plot of conversion loss versus signal frequency for both the mixer alone, and the complete circuit with IF hybrid.

I claim:

1. In a mixer system, of the type employing the heterodyne principle of operation by which the combination of an RF input signal and an LO signal generates modulation products including a desired IF signal and an undesired image signal, the combination comprising:
   (a) a dielectric substrate having a layer of conductor material affixed to one face thereof, (b) a slot transmission line having a predetermined length formed in said layer of conductor material, (c) first and second coplanar strip transmission lines formed in said layer of conductor material and disposed respectively adjacent one and the other end of said slot line and in longitudinally aligned relationship therewith, said first and second coplanar lines each comprising a center strip of conductor material and one and another longitudinal gaps to one and the other sides of said center strip, (d) said one and another longitudinal gaps of said first coplanar line at their ends adjacent the slot line being electrically connected to each other and to the slot line to form a first coplanar line-slot line hybrid junction, (e) said one and the other longitudinal gaps of said second coplanar line at their ends adjacent said slot line being electrically connected to each other and to the slot line to form a second coplanar line-slot line hybrid junction, (f) means for coupling the RF input signal into said slot line in such manner that the signal propagates in first and second equal signal components in opposite longitudinal directions along said slot line toward the first and second hybrid junctions respectively, (g) first and second heterodyne circuit means operatively associated with the first and second hybrid junctions respectively, (h) first and second coupling means operatively associated with said first and second coplanar lines, respectively, said first and second coupling means each including a means for coupling the LO input signal into the corresponding coplanar line and including a means for coupling the IF signal out from the corresponding coplanar line, (i) said predetermined length of the slot line being so chosen that upon respective injection into the first and second coplanar lines of one and another LO signals which are phase displaced by 90° and upon the resultant respective generation by the first and second heterodyne circuit means of one and another image signals which are phase displaced by 180°, said slot line will intercouple the first and second heterodyne circuit means in a manner which will effectively short circuit the combination of the one and another image signals.

2. The combination of claim 1, wherein;
(a) said predetermined length of said slot line represents an electrical length which is a small fraction of a wavelength of the RF input signal.

3. The combination of claim 1, and;
(a) a quadrature microwave hybrid device having first, second, third and fourth ports, said first port being adapted to receive a signal from an LO signal source, said second port being electrically connected to the means for coupling an LO signal into the coplanar line included in the first coupling means, said fourth port being electrically connected to the means for coupling an LO signal into the coplanar line included in the second coupling means, said hybrid device being operative to divide the LO signal into first and second components phase displaced by 90° provided as outputs from said second and fourth ports respectively, said third port being connected to a terminating impedance.

4. The combination of claim 3, and;
(a) another quadrature microwave hybrid device having first, second, third and fourth ports, said first and third ports, and said second and fourth ports, comprising first and second sets of opposite and isolated ports, said hybrid device upon respectively receiving equal signals having a common frequency but phase displaced by 90° at one and the other ports of one opposite and isolated set of ports being operative to combine as a signal having a common phase the received signals and to provide same at one port of the another set of opposite and isolated ports, the another port of said another set of opposed ports being connected to a terminating impedance, said means for coupling the IF signal out included in said first coupling means being electrically connected to one port of one set of opposite and isolated ports, said means for coupling the IF signal out included in said second coupling means being electrically connected to the other port of said one set of opposite and isolated ports.

5. The combination of claim 4, wherein;
(a) said predetermined length of said slot line represents an electrical length which is a small fraction of a wavelength of said RF input signal.

6. The combination of claim 1, wherein;
(a) said means for coupling the RF input signal into said slot line comprises a first strip member of conductor material affixed to the opposite face of said dielectric substrate and disposed in transverse relationship to the slot line and crossing same at the midpoint of its length.

7. The combination of claim 6, wherein;
(a) said first strip member has an input end and a terminal end and comprises at least two linear sections comprising a one-quarter wavelength stub section at its terminal end and another linear section adjacent said terminal section, the stub section having a relatively narrower width than said another linear section, said first strip member being so disposed that the position thereof at which the width changes between the stub section and the another section is disposed across the dielectric substrate from the center line of said slot line.

8. The combination of claim 7, wherein;
(a) said first and second coplanar lines are each of a predetermined length chosen to effect a conjugate match to the impedance presented by the first and second heterodyne means, respectively,
(b) said quarter wavelength stub section at the terminal end of the first linear section, the conjugate match between the first coplanar line and the first heterodyne circuit means, and the conjugate match between the second coplanar line and the second heterodyne circuit means being cooperative to provide double tuned response to RF output signals.

9. The combination of claim 6, wherein;
(a) the predetermined length of said slot line represents an electrical length which is a small fraction of a wavelength of the RF input signal.

10. The combination of claim 1, wherein;
(a) said first and second coplanar lines are of equal lengths so chosen to present an open circuit to second order idler signals produced by the operation of the first and second heterodyne circuit means.

11. The combination of claim 10, wherein;

(a) said predetermined length of said slot line represents an electrical length which is a small fraction of a wavelength of the RF input signal.

12. The combination of claim 1, wherein;
(a) said first and second coplanar lines are of equal lengths so chosen to present an open circuit to second order idler signals produced by the operation of the first and second heterodyne circuit means, and further so chosen to represent an electrical length which is approximately one-eighth wavelength of said RF input signal.

13. The combination of claim 1, wherein;
(a) said first coupling means and said second coupling means each have their means for coupling the LO signal into the coplanar line and their means for coupling the IF signal out from the coplanar line operatively connected to the coplanar line at the end thereof remote from the corresponding hybrid junction.

14. The combination of claim 1, wherein;
(a) said first and second coupling means each comprises a strip member affixed to the opposite face of said dielectric substrate, an aperture extending through said dielectric substrate, and a conductor element,
(b) the center strip of said first coplanar line and the center strip of said second coplanar line each having an end portion at the end of the center strip remote from the junction,
(c) said strip member having a signal input end and a terminal end said strip member having an end portion adjacent its terminal end, said strip member being disposed with its end portion in juxtaposed relationship to the end portion of the center strip of the associated coplanar line, and
(d) said conductor element extending through said aperture and electrically coupling said end portions of the center strip and strip line.

15. For use in a mixer system of the type employing the heterodyne principle of operation by which the combination of an RF input signal and an LO signal generates modulation products including a desired IF signal and an undesired image signal, the combination comprising:
(a) a dielectric substrate having a layer of conductor material affixed to one face thereof,
(b) a slot transmission line having a predetermined length formed in said layer of conductor material,
(c) first and second coplanar strip transmission lines formed in said layer of conductor material and disposed adjacent one and the other ends of said slot line and in longitudinally aligned relationship therewith, said first and second coplanar lines each comprising a center strip of conductor material and one and another longitudinal gaps to one and the other sides of said center strip,
(d) said one and another longitudinal gaps of the first coplanar line at their ends adjacent the slot line being electrically connected to each other and to the slot line to form a first bifurcated coplanar line-slot line hybrid junction,
(e) said one and another longitudinal gaps of the second coplanar line at their ends adjacent the slot line being electrically connected to each other and to the slot line to form a second bifurcated coplanar line-slot line hybrid junction,
(f) means for coupling an RF input signal into said slot line in such manner that the signal propagates in first and second equal components in opposite longitudinal directions along said slot line toward said first and second hybrid junctions respectively,
(g) first and second pairs of nonlinear devices operatively associated with said first and second hybrid junctions, respectively, said first and second pairs of nonlinear devices each comprising one and another nonlinear device electrically connected across one and the other of the forks of the bifurcated hybrid junction,
(h) first and second coupling means operatively associated with said first and second coplanar lines, respectively, said first and second coupling means each including a means for coupling the LO signal into the corresponding coplanar line and including a means for coupling the IF signal out from the corresponding coplanar line, and
(i) said predetermined length of the slot line being so chosen that upon respective injection into the first and second coplanar lines of one and another LO signals which are phase displaced by 90° and upon the resultant respective generation by the first and second pairs of nonlinear devices of one and another image signals which are phase displaced by 180°, said slot line will intercouple the first and second pairs of nonlinear devices in a manner which will effectively short circuit the combination of the one and another image signals.

16. The combination of claim 15, wherein;
(a) said first and second coplanar lines are each of a predetermined length chosen to effect a conjugate match to impedance presented by the respective associated pair of nonlinear devices.

17. A combination of claim 15, wherein;
(a) the predetermined length of said slot line represents a small fraction of a wavelength of the RF input signal.

18. The combination of claim 15, wherein;
(a) the individual nonlinear devices of the first pair of nonlinear devices and the individual nonlinear devices of the second pair of nonlinear devices are nonlinear unidirectional current devices,
(b) said first and second pairs of nonlinear devices each comprise one nonlinear unidirectional current device connected between the center strip of the corresponding coplanar line and a portion of the layer of conductor material which is disposed across one fork of said bifurcated hybrid junction and another nonlinear unidirectional current device connected between said center strip and another portion of the layer of conductor material which is disposed across the other fork of said hybrid junction, said one and another devices being so poled to form a unidirectional series circuit between said one and another portions of the layer of conductor material.

19. The combination of claim 18, and;
(a) means for forward biasing each unidirectional current device of each pair of unidirectional current devices.

20. The combination of claim 19, wherein;
(a) said means for forward biasing the unidirectional current devices include at least one d.c. isolated element formed of said layer of conductor material, said d.c. isolated element having its entire perimeter separated from the rest of the layer of conductor material by a gap, said d.c. isolated element being adapted for connection to a source of biasing potential, (b) the unidirectional series circuit associated with the first hybrid junction and the unidirectional series circuit associated with the second hybrid junction each having at least one of their ends connected to said at least one d.c. isolated element to forward bias the unidirectional devices therein, and (c) a.c. short-circuiting means coupling said at least one d.c. isolated element and the adjacent portions of said layer of conductor material.

21. A broadband mixer comprising:

a first coplanar strip line section;

a second coplanar strip line section which is longitudinally aligned with said first coplanar strip line section;

an intermediate slot line section longitudinally aligned with said first and second coplanar line sections and disposed between said first and second coplanar line sections to form first and second hybrid junctions with said first and second coplanar line sections;

first means for non-linearly combining an RF input signal provided to said slot line section with an LO input signal provided to said first coplanar line section to provide a first IF signal;

second means for non-linearly combining an RF input signal provided to said slot line section with an LO input signal provided to said second coplanar line section to provide a second IF signal;

means for applying an LO input signal to said first and second coplanar line sections, said applying means also conducting the IF signals from the first and second coplanar line sections.

22. A microwave broadband mixer comprising:

a first coplanar strip line section having a hybrid junction and a remote end;

a second coplanar strip line section having a hybrid junction end and a remote end, and longitudinally aligned with said first coplanar line section;

an intermediate slot line section which is longitudinally aligned with said first and second coplanar line sections and disposed between said first and second coplanar line sections to form first and second hybrid junctions with the hybrid junction ends of said first and second coplanar line sections;

first means for non-linearly combining an RF input signal provided to said slot line section with an LO input signal provided to said first coplanar line section to provide an IF signal, an image signal and a sum signal, said first combining means disposed within said first hybrid junction;

second means for non-linearly combining an RF input signal provided to said slot line section with an LO input signal provided to said second coplanar line section to provide an IF signal, an image signal and a sum signal, said second combining means disposed within said second hybrid junction, the LO input signal provided to said first coplanar line section being out-of-phase with respect to the LO input signal provided to said second coplanar line section such that the image signal of said first combining means is substantially the conjugate of the image signal of said second combining means; and means for applying an LO input signal to the remote ends of said first and second coplanar line sections, said applying means also conducting the IF signals from the remote ends of said first and second coplanar line sections.

23. A microwave broadband mixer comprising:

a first coplanar strip line section having a hybrid junction end and a remote end;

a second coplanar strip line section having a hybrid junction end and a remote end, and longitudinally aligned with said first coplanar line section;

an intermediate slot line section which is longitudinally aligned with said first and second coplanar line sections and disposed between said first and second coplanar line sections to form first and second hybrid junctions with the hybrid junction ends of said first and second coplanar line sections;

first means for non-linearly combining an RF input signal provided to said slot line section with an LO input signal provided to said first coplanar line section to provide an IF signal, an image signal and a sum signal, said first combining means disposed within said first hybrid junction; and second means for non-linearly combining an RF input signal provided to said slot line section with an LO input signal provided to said second coplanar line section to provide an IF signal, an image signal and a sum signal, said second combining means disposed within said second hybrid junction, said remote ends of said first and second coplanar line sections being located substantially one-quarter wavelength of the sum signal from the hybrid junction ends of the respective first and second coplanar line sections.

24. A microwave broadband mixer comprising:

a first coplanar strip line section having a hybrid junction end and a remote end;

a second coplanar strip line section having a hybrid junction end and a remote end, and longitudinally aligned with said first coplanar line section;

an intermediate slot line section which is longitudinally aligned with said first and second coplanar line sections and disposed between said first and second coplanar line sections to form first and second hybrid junctions with the hybrid junction ends of said first and second coplanar line sections;

first means for non-linearly combining an RF input signal provided to said slot line section with an LO input signal provided to said first coplanar line section to provide an IF signal, an image signal and a sum signal, said first combining means disposed within said first hybrid junction; and second means for non-linearly combining an RF input signal provided to said slot line section with an LO input signal provided to said second coplanar line section to provide an IF signal, an image signal and a sum signal, said second combining means disposed within said second hybrid junction, the longitudinal dimension of one of said first and second coplanar line sections effecting an impedance which is substantially a conjugate match of the impedance characteristic of one of the first and second non-linear combining means such that the impedance of one of the first and second non-linear combining means and the substantially conjugate impedance of one of the first and second coplanar line sections cooperate to present a parallel tuned circuit to the RF input signal for improved efficiency of said mixer.

25. The mixer of claim 24 further comprising:

a strip line for providing an RF input signal to said slot line section.

26. The mixer of claim 25 in which said strip line presents a series resonant circuit to the RF input signal, and the series resonant circuit and the parallel tuned circuit cooperate to give a double tuned RF signal response over a predetermined frequency band.

27. A microwave, integrated circuit, broadband mixer in which modulation products are produced in accordance with the heterodyne principle, said mixer comprising:
   an integrated circuit, dielectric substrate having a ground plane layer on one side thereof;
   a first coplanar strip line section having a hybrid junction end and a remote end, and having a center strip separated from the ground plane by longitudinally extending gaps between the sides of the center strip and the ground plane layer;
   a second coplanar strip line section having a hybrid junction end and a remote end, and having a center strip separated from the ground plane by longitudinally extending gaps between the sides of the center strip and the ground plane layer, said second coplanar strip line section being longitudinally aligned with said first coplanar strip line section;
   a slot line section which is longitudinally aligned with said first and second coplanar line sections and intermediately disposed between said first and second coplanar line sections such that the first and second coplanar line sections have bilateral symmetry about the transverse axis of the slot line to form first and second hybrid junctions with said first and second coplanar line sections;
   a first diode modulation circuit connected across said first hybrid junction to combine an RF signal with an LO signal to produce an IF signal, an image signal and a sum signal; and
   a second diode modulation circuit connected across said second hybrid junction to combine an RF signal with an LO signal to produce an IF signal, an image signal and a sum signal, where said second diode modulation circuit balances said first diode modulation circuit.

28. The mixer of claim 27 in which said first balanced diode modulation circuit comprises first and second diodes which are in electrical parallel connections of opposite polarity with respect to the first coplanar line, and which are in electrical series connections of common polarity with respect to the slot line; and in which said second balanced diode modulation circuit comprises third and fourth diodes which are in electrical parallel connections of opposite polarity with respect to the second coplanar line, and which are in electrical series connections of common polarity with respect to the slot line.

29. The mixer of claim 28 in which said first balanced diode modulation circuit comprises: a first diode coupled across a first fork of the first hybrid junction such that the anode of the diode is connected to the conductor layer and the cathode of the diode is connected to the center strip of the first coplanar strip line, and a second diode coupled across a second fork of the hybrid junction such that the anode of the diode is connected to the center strip of the coplanar strip line and the cathode of the diode is connected to the conductor layer; and in which said second balanced diode modulation circuit comprises: a third diode coupled across a first fork of the second hybrid junction such that the anode of the diode is connected to the conductor layer and the cathode of the diode is connected to the center strip of the second coplanar strip line, and a fourth diode coupled across a second fork of the second hybrid junction such that the anode of the diode is connected to the center strip of the second coplanar strip line and the cathode of the diode is connected to the conductor layer.

30. The mixer of claim 27 in which the LO signal combined with the RF signal by said first and second balanced diode modulation circuits are provided to said first and second coplanar line sections respectively.

31. The mixer of claim 30 in which the LO signal provided to said first coplanar line section is out-of-phase with respect to the LO signal provided to said second coplanar line section for controlling the image signals of the modulation products of said RF signal and said LO signals.

32. The mixer of claim 31 in which the LO signal applied to said first coplanar strip line section is substantially ninety degrees out-of-phase with respect to the LO signal applied to said second coplanar strip line section.

33. The mixer of claim 31 in which the longitudinal dimension of said slot line is short in comparison to the wavelength of said RF signal to effectively short circuit said image signals.

34. The mixer of claim 31 in which the longitudinal dimension of the first and second coplanar line sections is such that they effect an open circuit condition for the sum signals of the modulation products of the first and second balanced diode modulation circuits.

35. The mixer of claim 31 further comprising:
   a strip line located on the opposite side of said dielectric substrate from said ground plane layer for providing an RF input signal to said slot line section.

36. The mixer of claim 31 in which the longitudinal dimension of the first and second coplanar line sections is such that they effect an impedance which is substantially the conjugate of the impedance of the first and second balanced diode modulation circuits respectively such that the impedance of the first and second diode modulation circuits and the substantially conjugate impedance of the first and second coplanar line sections respectively, cooperate to present a parallel tuned circuit to the RF input signal for improved efficiency of said mixer.

37. The mixer of claim 36 further comprising:
   a strip line located on the opposite side of said dielectric substrate from said ground plane layer for providing an RF input signal to said slot line section, where the strip line presents a series resonant circuit to the RF input signal and the series resonant circuit and the parallel tuned circuit cooperate to give a double tuned RF signal response over a predetermined frequency band.

38. The mixer of claim 37 in which said strip line comprises:
   a resonant transformer section having a length which is substantially equal to one-quarter wavelength of the RF input signal; and
   a quarter wave stub of narrower width than the resonant transformer section and forming a junction with the resonant transformer section which is located essentially opposite the longitudinal centerline of the slot line.

39. The mixer of claim 31 further comprising:

means for applying an LO input signal to said first and second coplanar line sections.

40. The mixer of claim 39 in which said applying means also conducts the IF signals from the first and second coplanar line sections.

41. The mixer of claim 39 in which said applying means includes:
a microstrip transmission line for applying an LO signal to said first and second coplanar line sections; and
first and second feedthrough conductors located between said microstrip line and said coplanar transmission line, said feedthrough conductors electrically connecting the center strips of the first and second coplanar line sections to the microstrip transmission line.

42. The mixer of claim 41 in which said applying means further includes:
an interdigitated quadrature hybrid for providing a first LO signal and a second LO signal which is substantially 90° out-of-phase with respect to the first LO signal.

43. The mixer of claim 41 in which said applying means also conducts the IF signals from the first and second coplanar line sections and in which said applying means further includes:
first and second IF output channels for conducting the IF signals of said first and second coplanar strip lines respectively.

44. The mixer of claim 43 further comprising:
means for combining the IF outputs of the coplanar lines which are conducted by the first and second IF output channels to provide an IF output signal.

45. The mixer of claim 43 in which said applying means further includes:
at least one capacitor which is conductive at the frequency of the LO signal but which is non-conductive at the frequency of the IF signals to prevent at least one of the IF signals of the first and second coplanar line sections from entering the interdigitated quadrature hybrid.

46. The mixer of claim 45 in which said applying means further includes:
at least one waveguide element; and
at least one waveguide stub portion which is disposed to the waveguide element such that said waveguide stub portion and said waveguide element cooperate to prevent the coupling of at least one of the LO signals of the first and second coplanar line sections into one of the IF output channels.

47. The mixer of claim 46 further comprising:
a quadrature hybrid for combining the outputs of the coplanar lines which are conducted by the first and second IF output channels to provide an IF output signal.

48. A balanced, broadband mixer in which the modulation products of RF and LO signals are produced in accordance with the heterodyne principle, said mixer comprising:
a first coplanar strip line section having a hybrid junction end and a remote end;
a second coplanar strip line section having a hybrid junction end and a remote end, and longitudinally aligned with said first coplanar line section;
an intermediate slot line section which is longitudinally aligned with said first and second coplanar line sections and disposed between said first and second coplanar line sections to form first and second hybrid junctions with the hybrid junction ends of said first and second coplanar line sections;
first means for non-linearly combining the RF signal provided to said slot line section with the LO input signal provided to the first coplanar line section to generate an IF signal, an image signal, and a sum signal, said first non-linear combining means being disposed across said first hybrid junction;
second means for non-linearly combining the RF signal which is provided to said slot line section with the LO input signal provided to the second coplanar line section to generate an IF signal, an image signal, and a sum signal, said second non-linear combining means being disposed across said second hybrid junction; and
a bias element for electrically biasing the first and second non-linear combining means to reduce the power requirement of the LO signal.

49. The mixer of claim 48 in which said bias element is disposed adjacent to one side of the longitudinally arranged first and second coplanar line and the slot line.

50. A microwave, integrated circuit, broadband mixer in which modulation products are produced in accordance with the heterodyne principle, said mixer comprising:
an integrated circuit, dielectric substrate having a ground plane layer on one side thereof;
a first coplanar strip line section having a hybrid junction end and a remote end, and having a center strip separated from the ground plane by longitudinally extending gaps between the sides of the center strip and the ground plane layer;
a second coplanar strip line section having a hybrid junction end and a remote end, and having a center strip separated from the ground plane by longitudinally extending gaps between the sides of the center strip and the ground plane layer, said second coplanar strip line section being longitudinally aligned with said first coplanar strip line section;
a slot line which is longitudinally aligned with said first and second coplanar line sections and intermediately disposed between said first and second coplanar line sections such that the first and second coplanar line sections have bilateral symmetry about the transverse axis of the slot line to form first and second hybrid junctions with said first and second coplanar line sections;
a first diode modulation circuit connected across said first hybrid junction to combine an RF signal with an LO signal to produce an IF signal, an image signal and a sum signal;
a second diode modulation circuit connected across said second hybrid junction to combine an RF signal with an LO signal to produce an IF signal, an image signal and a sum signal; and
a bias element having a predetermined bias potential for forward biasing the first and second modulation circuits to reduce the power requirement of the LO signal, said bias element disposed adjacent to one side of the longitudinally arranged first and second coplanar lines and the slot line such that one edge of the bias element forms one boundary of the slot line and one boundary of a longitudinally extending gap of the first and second coplanar lines, and the other edges of the bias element form one boundary of a perimeter gap between the bias element and the conductor layer to provide electrical isolation of the bias element from the conductor layer.

51. The mixer of claim 50 in which said first balanced diode modulation circuit comprises first and second diodes which are in electrical parallel connections of opposite polarity with respect to the first coplanar line, and which are in electrical series connections of common polarity with respect to the slot line; and in which said second balanced diode modulation circuit comprises third and fourth diodes which are in electrical parallel connections of opposite polarity with respect to the second coplanar line, and which are in electrical series connections of common polarity with respect to the slot line.

52. The mixer of claim 51 in which said first balanced diode modulation circuit comprises: a first diode coupled across a first fork of the first hybrid junction such that the anode of the diode is connected to the conductor layer and the cathode of the diode is connected to the center strip of the first coplanar strip line, and a second diode coupled across a second fork of the hybrid junction such that the anode of the diode is connected to the center strip of the coplanar strip line and the cathode of the diode is connected to the bias element; and in which said second balanced diode modulation circuit comprises: a third diode coupled across a first fork of the second hybrid junction such that the anode of the diode is connected to the conductor layer and the cathode of the diode is connected to the center strip of the second coplanar strip line, and a fourth diode coupled across a second fork of the second hybrid junction such that the anode of the diode is connected to the center strip of the second coplanar strip line and the cathode of the diode is connected to the bias element.

53. The mixer of claim 50 in which the LO signal combined with the RF signal by said first and second balanced diode modulation circuits are provided to said first and second coplanar line sections respectively.

54. The mixer of claim 53 in which the LO signal provided to said first coplanar line section is out-of-phase with respect to the LO signal provided to said second coplanar line section for controlling the image signals of the modulation products of said RF signal and said LO signals.

55. The mixer of claim 54 in which the LO signal applied to said first coplanar strip line section is substantially ninety degrees out-of-phase with respect to the LO signal applied to said second coplanar strip line section.

56. The mixer of claim 54 in which the longitudinal dimension of said slot line is short in comparison to the wavelength of said RF signal to effectively short circuit said image signals.

57. The mixer of claim 54 in which the longitudinal dimension of the first and second coplanar line sections is such that they effect an open circuit condition for the sum signals of the modulation products of the first and second balanced diode modulation circuits.

58. The mixer of claim 54 in which the longitudinal dimension of the first and second coplanar line sections is such that they effect an impedance which is substantially the conjugate of the impedance of the first and second balanced diode modulation circuits respectively.

59. The mixer of claim 54 further comprising: at least one coupling capacitor which provides a low impedance path for RF, LO and IF signals between said bias element and the conductor layer of said dielectric substrate.

* * * * *